United States Patent

Olney, Jr.

[15] 3,646,246

[45] Feb. 29, 1972

[54] CIRCUIT BOARD AND METHOD OF MAKING

[72] Inventor: Frederick D. Olney, Jr., Phoenix, Ariz.

[73] Assignee: Honeywell Information Systems Inc.

[22] Filed: May 22, 1970

[21] Appl. No.: 39,728

[52] U.S. Cl. ..........174/68.5, 29/625, 29/626, 317/101 CC, 339/17 C

[51] Int. Cl. ..........H05k 3/32

[58] Field of Search ..........174/68.5; 317/10 B, 101 G, 317/101 CC, 101 CM, 117 FF; 29/624, 625, 626, 628; 339/17 C, 18

[56] References Cited

UNITED STATES PATENTS

| | | | |
|---|---|---|---|
| 3,022,369 | 2/1962 | Rayburn | 174/68.5 |
| 3,135,935 | 2/1964 | Engelbrecht | 174/117 FF X |
| 3,470,612 | 10/1969 | Helms | 174/68.5 X |
| 3,506,879 | 4/1970 | Maxwell et al. | 317/101 CC |

*Primary Examiner*—Darrell L. Clay

*Attorney*—Edward W. Hughes, H. Gordon Shields, James A. Pershon, Frank L. Neuhauser, Oscar B. Waddell and Joseph B. Forman

[57] ABSTRACT

A circuit board and a method of making same, the circuit board having holes formed therethrough in which selected ones of the holes are electrically connected by a method in which conductive wire is sewn into the holes and retained therein to form an electrical connection to conductive material adjacent to the holes.

9 Claims, 8 Drawing Figures

INVENTOR.
FREDERICK D. OLNEY JR.
BY Herbert C. Haynes Jr.
AGENT

Patented Feb. 29, 1972

3,646,246

3 Sheets-Sheet 3

CIRCUIT BOARD AND METHOD OF MAKING

BACKGROUND OF THE INVENTION

1. Field of the Invention

This invention relates to circuit boards and more particularly to electrical connections thereon and to a method of providing the electrical connections.

2. Description of the Prior Art

For a clear understanding of the terminology employed throughout this specification, a circuit board is defined as including a substrate for mounting electrical elements and providing means for electrically connecting these elements. The substrate is defined as a planar structure having apertures formed therein with conductive material provided adjacent to or within the apertures. Specific types of circuit boards and the techniques for mounting the elements and for making the electrical connections will hereinafter be described in detail.

Electrical elements such as resistors, capacitors, transistors, integrated circuit packages and the like are generally mounted and electrically connected by two basic techniques. These techniques will hereinafter be referred to as the wire-wrap technique and the printed circuit technique.

The wire-wrap technique employs pins which are secured in the apertures of the substrate so that they protrude exteriorly from both sides thereof. The elements are mounted on one side of the substrate by either direct attachment to the pins or with special connector devices. The electrical connection between selected pins employed in this technique is accomplished by wrapping conventional conductive wire to the pins on the other side of the substrate opposite to the element mounting side.

When the printed circuit technique is utilized, the electrical connections are provided by printed circuitry which is made by etching a conductive layer formed on a substrate. The electrical elements are mounted and electrically connected to the printed circuitry by attaching the element leads directly to the surface of the etched circuitry. Another way of mounting the elements is by inserting the element leads within apertures formed through the substrate and electrically connecting the leads to the etched circuitry adjacent the apertures.

The wire-wrap technique has received wide usage due to its inherent flexibility, that is, the ease with which changes can be made thereon in the event of errors or design changes. However, very elaborate and expensive machinery is required such as wire-wrapping machines and pin insertion machines. Other factors making the wire-wrap technique less than the ultimate solution are space, weight, cost of the pins, expense of the wire used, and the limited number of wires that can be wrapped on a pin.

The printed circuit technology has traditionally employed an etched printed circuit on one or both sides of the substrate. This technique has proven satisfactory for relatively simple mass-produced applications. However, with the increased packaging densities of today's modern equipment, the need for more connections than can be obtained with this technique became evident.

In an attempt to solve the problem of the increasing need for more connections, the multilayer etched printed circuit technology was developed. This technology comprises a plurality of individually etched circuits which are laminated into a multilayer board. The multilayer technique has several advantages over the wire-wrap technique such as denser packaging and shorter distances that the signals must travel. However, the multilayer technology has received limited use due to the extreme care required during fabrication, high cost, and the inability to modify boards made by using this technology.

A hybrid board has been developed to combine the advantages of etched printed circuitry with the flexibility of the wire-wrap technique. The hybrid board utilizes one or more layers of etched printed circuitry for the most common stable circuitry and uses the wire-wrap technique for custom circuits and the connections that are subject to change. This hybrid board is at best a compromise, and has one serious manufacturing problem. This problem is that pressing a pin into a multilayer board can cause deformation which may destroy the board by delaminating it in the vicinity of the hole. This is particularly likely to occur if all the variables such as dimension tolerances and temperatures are not precisely controlled during manufacture.

In view of the foregoing, a need exists for a new electrical connection technique which substantially reduces the cost of manufacture, meets packaging and signal travel distance requirements, and lends itself readily to modification and correction.

SUMMARY OF THE INVENTION

In accordance with the invention claimed, a new and useful circuit board and a method for forming electrical connections thereon is disclosed.

The circuit board of the present invention comprises conductors which are looped into preformed apertures and electrically connected to conductive areas provided adjacent to or within the apertures.

The method of making the circuit board of the present invention comprises sewing a conductor into selected apertured conductive areas and electrically connecting the conductors to the selected apertured conductive areas.

The briefly described circuit board and method of making same, of this invention overcomes the problems of the wire-wrap and printed circuit techniques by a new technique which contains the advantages of both and eliminates their disadvantages.

Accordingly, it is an object of this invention to provide a new method for making a circuit board.

Another object of this invention is to provide a new method for forming an electrical connection on a circuit board.

Another object of this invention is to provide a new method for forming electrical connections between selected conductive areas on a circuit board.

Another object of this invention is to provide a new and useful circuit board.

A further object of this invention is to provide a new and useful circuit board which is light weight and compact.

A still further object of this invention is to provide a new and useful circuit board which may be easily altered to correct errors or incorporate subsequent design changes.

The foregoing and other objects of this invention, the various features thereof, as well as the invention itself, may be more fully understood from the following description when read in conjunction with the accompanying drawings.

DESCRIPTION OF THE PREFERRED EMBODIMENT

Figure 1:
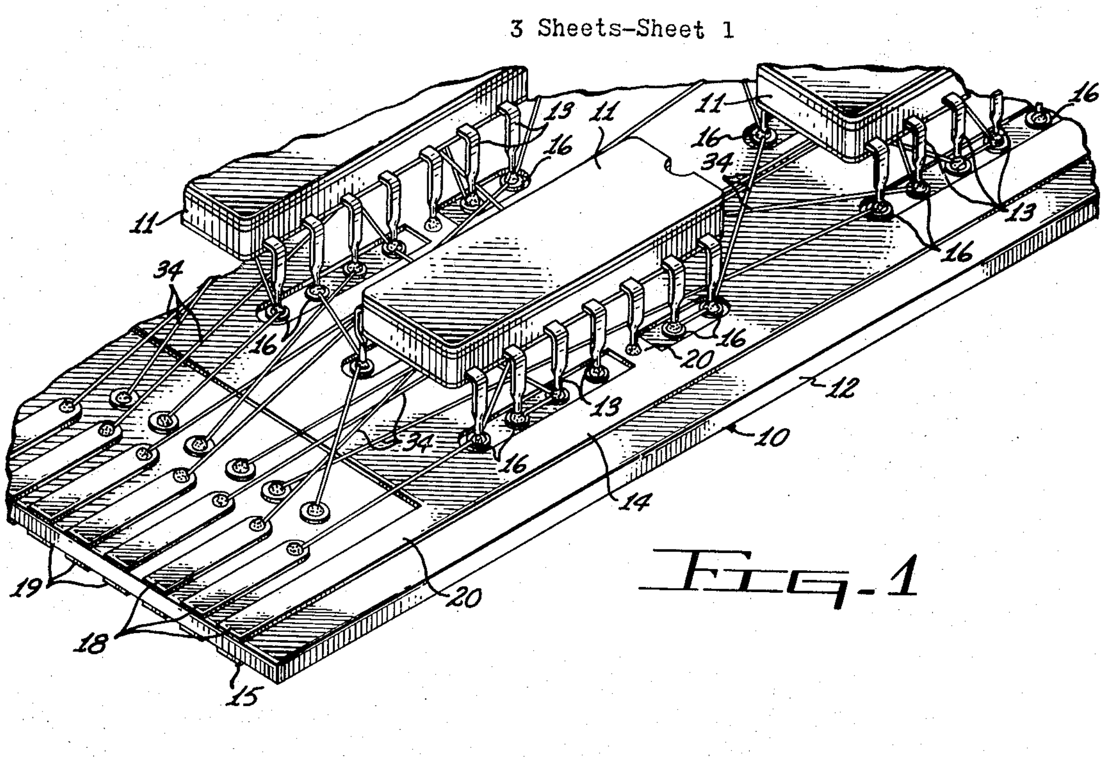
FIG. 1 is a fragmentary perspective view illustrating a circuit board incorporating the features of the present invention.

Referring more particularly to the drawings, FIG. 1 illustrates a fragmentary portion of a circuit board 10 having electrical elements 11 mounted thereon. The electrical elements shown are dual-in-line integrated circuit packages having a plurality of leads 13 extending therefrom. The particular type of circuit board and electrical elements shown were chosen for illustrative purposes only, as the hereinafter described method may be applied to any type of electrical element and circuit board.

The circuit board 10 comprises a substrate 12 of insulative material, such as epoxy glass. Printed circuits 14 and 15 are formed on the substrate 12 by a printing and etching process as will hereinafter be described in detail. Discrete electrical circuits, such as signal carrying lines, are formed by stringing continuous insulated conductors 34 sequentially to predetermined locations and electrically connecting the conductors thereto.

Printed circuit technology is well known throughout the industry, therefore, the methods employed will be only briefly described. A thin laminate of conductive material, such as an alloy of copper, is bonded to both sides of the substrate 12 which is then drilled to provide holes in predetermined arrays. A photosensitive material is then applied to the copper laminates and a transparency of the circuit art work is accurately positioned with respect to the board. The next operations of exposure and development are similar to those employed to produce a snapshot or movie film. The board is then subjected to chemicals which etch away the copper in the exposed areas (or unexposed areas in an alternate process).

The photosensitive material is then removed and a solder-resistive coating is applied through a mask to selected areas. The board is next solder coated in the selected areas to provide corrosion resistance and tinned surfaces for subsequent soldering operations. It should be understood that the hereinbefore described manufacturing process contains various inspection, cleaning and surface preparation steps, and may contain other special techniques such as plating the bores of the holes, gold plating the edge contacts, and the like.

In the particular type of board shown in FIG. 1, the manufacturing process results in conductive areas 16 commonly called lands or pads, the process also provides edge contacts 18 and 19, as well as the circuits 14 and 15. The circuit is selectively connected to desired areas by conductive runs 20.

The conductive areas 16 have been described as being formed by the etched printed circuitry technique, but it should be understood that the conductive areas 16 may be formed by other methods such as pressing a bushing of conductive material (not shown) into holes formed in the substrate.

Figure 2:
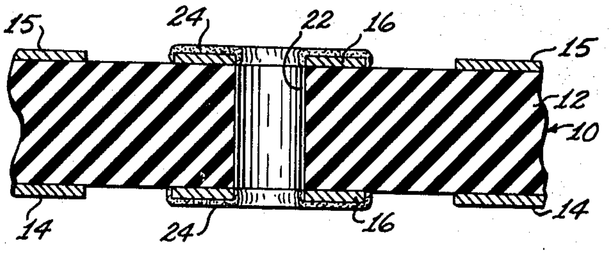
FIGS. 2–7 are enlarged sectional views partially in schematic form illustrating the steps of the method of the present invention.
Figure 3:
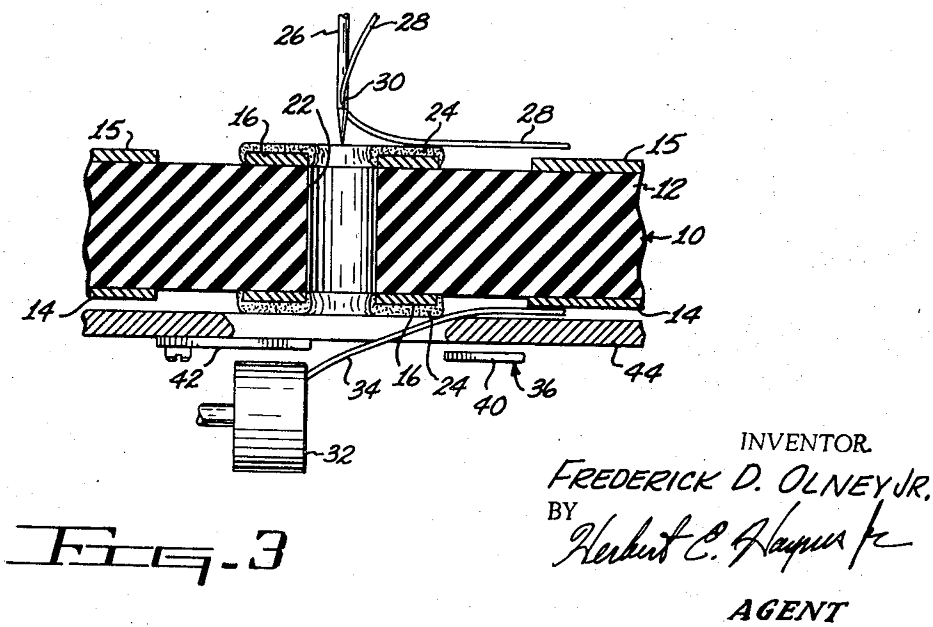

With the board 10 prepared as described, reference is now made to FIGS. 2 through 7 where the steps of the method of this invention are sequentially illustrated. FIG. 2 is an enlarged sectional view of the circuit board 10 illustrating the substrate 12 and pads 16 having a hole 22 drilled or otherwise formed therethrough. Pads 16 are solder plated, dipped, or otherwise provided with a coating of solder 24. FIG. 3 shows the same board construction, and also shows, in schematic form, tooling to perform the subsequent steps of the present invention. The tooling is similar to that employed in a conventional sewing machine (not shown) and comprises a needle 26 having a nonconductive material such as thread 28 passing through the eye 30 in the usual manner. Located below the board 10 is a conventional bobbin 32 on which is wound the insulated conductive wire 34. Also located below the board 10 is a cutter mechanism 36 actuatable on command to cut the wire 34.

Figure 4:
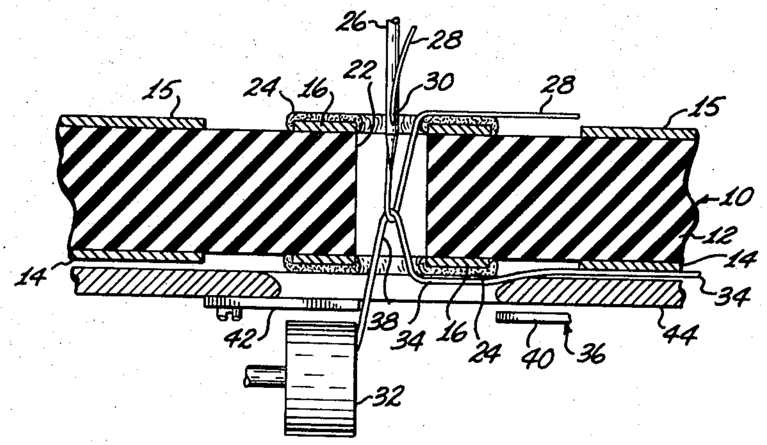

FIG. 4 illustrates the needle 26 as having passed through the hole 22, around the bobbin 32 in the conventional manner so as to loop around wire 34, thus forming a conductor-retaining means. Retraction of the needle back through the hole forms the wire into a loop 38 and pulls it part way into the hole. The distance that loop 38 is pulled into the hole may be controlled by appropriate adjustment to the tension on thread 28. In some instances, such as completion of the electrical connections in a series or plurality of pads, it is necessary to terminate the wire after it has been looped into the last hole in the series. Termination of the wire is accomplished by a movable cutter blade 40 cooperating with a stationary blade 42 formed on a board-mounting platform 44.

Figure 5:
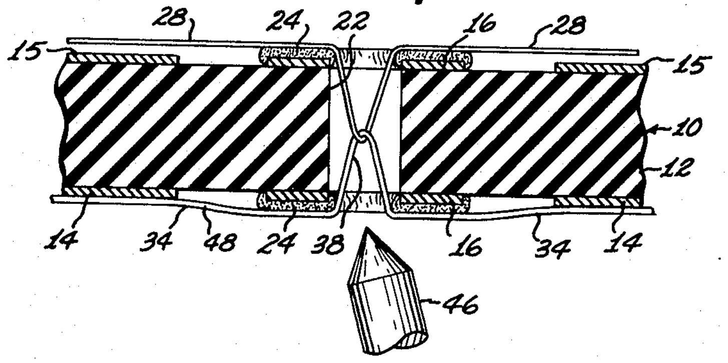

FIG. 5 shows the completed stitch after the steps described with reference to FIG. 4 have been completed, and also shows a heat-applying means 46, such as a soldering iron, being applied to the wire side of the board 10. The wire 34, as will hereinafter be described in detail, is coated with an insulation which melts in the range of 680° to 810° F., depending on wire size. The solder 24 which was applied to the pads 16 during board preparation may in the preferred embodiment be an alloy of 63 percent tin and 37 percent lead which results in an alloy having a eutectic temperature of approximately 361° F., and will more completely liquefy at approximately 390° F. Therefore, it may be seen that applying sufficient heat to melt the insulation on the wire will reflow the solder 24.

The hole diameters in common use on circuit boards are in the range of 30 to 50 mils, and a wire diameter in the range of 5 to 10 mils is contemplated as being best suited for the method of this invention, although other diameters, both smaller and larger, are feasible. Therefore, several wires may be inserted into a given hole without difficulty.

Figure 6:
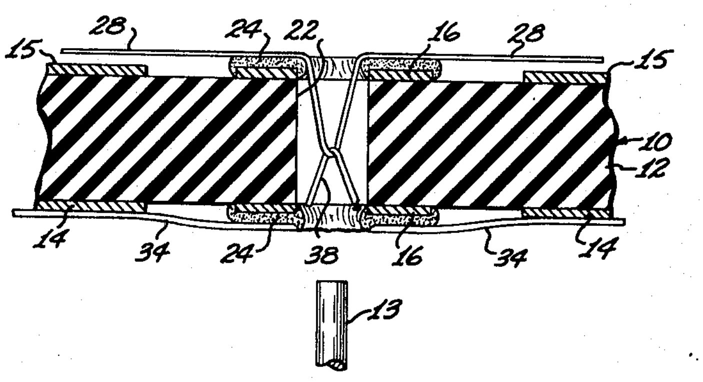

As shown in FIG. 6, after wire 34 is installed and soldered in place, a substantial area of the hole may be left open for additional wire installation or for insertion of a lead 13 of the electrical element 11. (See also FIG. 1)

It should be understood that the electrical element leads 13 may be connected to the conductive areas 16 rather than inserted into the holes 22.

Figure 7:
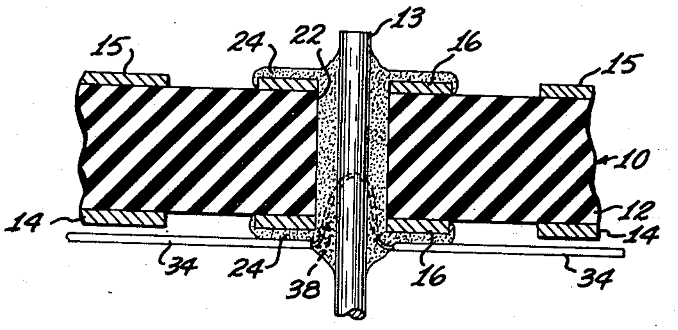

FIG. 7 shows a completed connection which was formed by reheating the board, with the wires and element leads inserted, in a molten solder bath or flow-solder machine, which by a manner well known in the art fills the hole by capillary action. An additional feature of the flow-solder step is that the thread 28 (See FIGS. 3–6) is burned off during flow soldering. The removal of the thread may of course be accomplished prior to flow soldering by other methods, such as subjecting the board to an open flame, focused infrared heat, or by mechanical removal, although removal of the thread is unnecessary from a functional standpoint, and is done merely for appearances.

Wire suitable for use in the method of this invention is commercially available from several manufacturers and under an equal number of trade names. The National Electrical Manufacturers Association (NEMA) designates the identification of the wire as 105C (Class A) NEMA Standard MW 2-1959. The 105C (Class A) indicates the operational temperature range, and the MW 2 specifies magnet wire, polyurethane coated. Wire conforming to these specifications is marketed under the trade name "Soldereze" by the Phelps Dodge Magnet Wire Corporation, and under the trade name "Analac" by the Anaconda Wire and Cable Company, among others.

The polyurethane insulation film is desirable for this application as it will not carbonize in the hereinbefore described melting temperature range of 680° –810° F. Therefore, no contaminants will be formed which will adversely affect the solder connection. The wire will readily solder without flux in the above temperature range; however, a coating of flux may be added to the conductive areas 16 which will facilitate the soldering step.

The machine used for installing the wires may be a conventional sewing machine with modifications to the tensioning devices. All tension on the bobbin 32 is removed to allow the wire 34 to freely pay off the bobbin upon demand. Tension on the thread 28 is selectively applied, that is, tension is applied when an actual stitch is being formed, and removed when the board 10 is moved relative to the sewing machine and board-mounting platform 44 to allow free movement between hole locations.

To automate the installation of wires according to the method of the present invention, the board is mounted on an X–Y table (not shown) which may be moved under control of a program-operated machine in accordance with techniques well known in the art.

Another step which is optional in the method of the present invention is applying a coating of insulative material such as polyurethane or epoxy to the wires which have been sewn in place. The coating which may be sprayed, painted, or otherwise applied, when cured, acts as a fixative to mechanically attach the wires to the board surface and also acts as a protective barrier.

Figure 8:
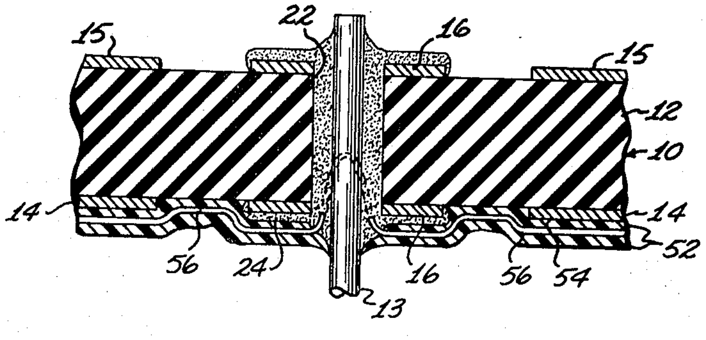
FIG. 8 is an enlarged sectional view illustrating a modification of the method of the present invention.

A modification of the method of the present invention is illustrated in FIG. 8. This modification shows the board 10 as having been prepared in accordance with the hereinbefore-described techniques. The modifications in this alternate method comprise applying a coating 52 of a curable insulative fixative, such as polyurethane or epoxy, on the surface 54 of the board 10. A noninsulated tin-coated conductive wire 56, commonly called buss wire, is then installed using the same sewing steps previously disclosed. After wire 56 has been installed, a second coating 52 of fixative is applied over wires 56. Curing of the insulative coatings forms a homogenous material completely encapsulating the wire.

Although the circuit board and method of making it disclosed herein have described and illustrated the conductors and electrical elements being installed on the same surface of the board, the conductors may be installed on both surfaces. This is possible due to the high melting temperature of the insulation as compared to the relatively low temperature at which solder melts as hereinbefore described. The temperature differential makes it possible to process the completed circuit board through the flow-soldering machine without disturbing the conductors.

While the principles of the invention have now been made clear in an illustrative embodiment, there will be immediately obvious to those skilled in the art many modifications of structure, arrangement, proportions, the elements, materials, and components, used in the practice of the invention, and otherwise, which are particularly adapted for specific environments and operating requirements without departing from those principles. The appended claims are therefore intended to cover and embrace any such modifications, within the limits only of the true spirit and scope of the invention.

What I claim is:

1. A method of electrically connecting an insulated conductor within an aperture formed in a conductive area of a substrate comprising the steps of:

a. tinning the conductive area of the substrate with a solderable material;
b. forming a loop in the insulated conductor within the aperture;
c. holding said loop of the insulated conductor within the aperture with a conductor retaining means;
d. heating the conductive area to melt the insulation in the area of said loop of said insulated conductor and to reflow said solderable material to electrically connect said conductor to the conductive area; and
e. removing said conductor retaining means after the heating step.

2. A method of electrically connecting an insulated conductor within an aperture formed in a conductive area of a substrate as claimed in claim 1 wherein said holding step comprises looping a thread of nonconductive material over said loop of the insulated conductor, said thread of nonconductive material entering the aperture from a direction opposite to the entry of the insulated conductor.

3. A method of electrically connecting selected conductive areas of a circuit board having apertures formed therethrough, one aperture being provided adjacent to each of the selected conductive areas the method comprising the steps of:

a. tinning the selected conductive areas with a solderable material;
b. forming a loop in an insulated conductive wire within one aperture;
c. stringing said insulated conductive wire to another aperture and repeating the forming step;
d. repeating the stringing and forming steps for each of the selected conductive areas to be electrically connected;
e. heating each of the selected conductive areas to melt the insulation in the area of said loop of said insulated conductive wire and reflow said solderable material to attach said insulated conductive wire to the conductive areas;
f. mounting at least one electrical element on the circuit board by inserting the leads thereof into the apertures; and
g. reheating the selected conductive areas to attach the leads within the apertures.

4. A method of electrically connecting a plurality of selected conductive areas formed on a circuit board, the circuit board defining holes which are positioned on the circuit board so that a hole is associated with each of the selected conductive areas, the method comprising the steps of:

a. tinning the selected conductive areas with a solderable material;
b. sewing an insulated conductor sequentially into each of the holes associated with the selected conductive areas, said sewing comprising the steps of,
   1. inserting a nonconductive thread through said hole;
   2. passing said nonconductive thread around said insulated conductor; and
   3. pulling said nonconductive thread back through said hole so that a loop is formed in said insulated conductor and said loop is pulled into said hole;
c. cutting said insulated conductor when all of the holes associated with the selected conductive areas have said insulated conductor sewn therein; and
d. heating the selected conductive areas to melt portions of the insulation of said insulated conductor and to reflow said solderable material to attach said insulated conductor to the selected conductive areas.

5. A method of electrically connecting selected apertured conductive areas of a circuit board, the method comprising the steps of:

a. applying a first coating of curable insulative fixative to the circuit board;
b. sewing a conductive wire into each of the selected apertured conductive areas;
c. cutting said conductive wire after all of the selected apertured conductive areas have had said conductive wire sewn therein;
d. soldering said conductive wire to the selected apertured conductive areas;
e. applying a second coating of curable insulative fixative to the circuit board; and
f. curing said first and second coatings of curable insulative fixative to form a homogenous insulative encapsulant for said conductive wire.

6. A circuit board comprising:

a. a substrate for supporting electrical circuitry, said substrate having at least one aperture therein;
b. a conductive area supported on said substrate adjacent to the aperture for securing electrical circuitry thereto;
c. a conductor for conducting electrical signals in conjunction with the electrical circuitry, said conductor including a looped portion extending into the apertures;
d. a thread inserted into the aperture and looped over the loop of said conductor retaining the loop of said conductor within the aperture; and
e. means electrically connecting the loop of said conductor to said conductive area.

7. A circuit board as claimed in claim 6 in which said means electrically connecting the loop of said conductor to said conductive area comprises a solder connection.

8. A circuit board for conducting electrical signals to at least one electrical element thereon, said element having at least a single lead extending therefrom, comprising:

a. a substrate of insulative material having at least one aperture formed therein;
b. a conductive area formed on said substrate adjacent to the aperture;
c. a conductor for conducting the electrical signals, said conductor having a looped portion extending into the aperture;
d. means electrically connecting said conductor to said conductive area and to the lead of the electrical element; and
e. a thread inserted into the aperture and looped over the loop of said conductor retaining the conductor within the aperture.

9. A circuit board as claimed in claim 8 wherein said conductor comprises an insulated conductive wire with the insulation removed in the area of the looped portion thereof.

* * * * *